United States Patent

Glaser

[15] 3,691,429

[45] Sept. 12, 1972

[54] MOUNTING STRUCTURE FOR MINIATURE CIRCUIT ELEMENTS

[72] Inventor: Peter S. Glaser, Culver City, Calif.

[73] Assignee: Electronic Arrays, Inc., Mountain View, Calif.

[22] Filed: March 18, 1971

[21] Appl. No.: 125,585

[52] U.S. Cl. .............317/101 CC, 29/626, 174/68.5, 339/17 C

[51] Int. Cl. ............................H05k 1/18, H05k 3/32

[58] Field of Search .......174/68.5, DIG. 3; 339/17 R, 339/17 C, 17 CF, 18 B, 276 A; 317/101 C, 101 CC, 101 CM, 101 CE; 29/626

[56] References Cited

UNITED STATES PATENTS

| | | | |
|---|---|---|---|
| 3,644,792 | 2/1972 | Fields | ..................174/68.5 X |

OTHER PUBLICATIONS

" High Density Dual-in-Line Packaging Panels" catalog No. 266, pub. by Electronic Design, Aug. 2, 1967, Vol. 15, No. 16, between pp. 112 and 113.

*Primary Examiner*—Darrell L. Clay

[57] ABSTRACT

LC circuits are mounted on a board in rows of sockets along rows of pins on the same side of the board, and interconnected by strung wires. The sockets are interconnected with the pins transverse to the direction of the rows on the other side of the board.

5 Claims, 7 Drawing Figures

INVENTOR:
Peter S. Glaser

By Smyth, Roston & Pavitt
ATTORNEYS

PATENTED SEP 12 1972

3,691,429

INVENTOR:
Peter S. Glaser

By Smyth, Roston & Pavitt
ATTORNEYS

MOUNTING STRUCTURE FOR MINIATURE CIRCUIT ELEMENTS

The present invention relates to a mounting structure for miniature circuit elements, particularly for mounting large scale integrated circuits or LC circuits, and for providing interconnect facilities for different circuit elements of that type.

The art of printed circuitry is well developed at the present time. It has found ample utility, particularly for interconnecting small discrete circuit elements, and for providing also interconnections between and to integrated circuit elements having but a few terminals each. The development of large scale integrated circuits has in many parts obviated the need for external interconnections, such as interconnections by means of printed circuit patterns, because these connections are included within the chip of the LC circuit. On the other hand, as the number of circuit components included within an LC chip increases, the number of external connections to the chip has increased likewise. Due to dimensional limitations of the chip itself and due to inherent need for closely spacing of terminal connections to the chip, the packaging assembly of the chip is required to include a carefully designed pattern of connecting terminals, fanning out from the chip proper.

In the recent past, it was found most practical to mount an LC circuit, as a chip, on a flat rectangular slab of insulated material, to be used as basic mounting and support structure for the chip. Connecting elements lead from the terminals at and on the chip itself to a pair of rows of contact prongs extending from the long side of the rectangle. Typically, each row may have twelve prongs.

It was found difficult to mount a plurality of such packaged LC elements on a small printed circuit board and to provide interconnect pattern between several multi terminal LC circuits by means of printed circuit techniques; particularly in cases where the space available for providing connections is limited. Nothing really precludes utilization of printed circuit techniques to interconnect multi-prong LC chips on a PC board, except that the board will be quite large. On the other hand, it will be recalled that the printed circuit technique was developed to provide for large numbers of connections without requiring manual wire stringing. Now, in the recent past, so-called wire wrapping machines have been developed which provide connections between contact pins on an automatic basis. These machines have obviated to some extent the need for printed circuit techniques.

It is an object of the present invention to provide a mounting board structure for plural LC circuits minimizing the use of printed circuit techniques and using wire stringing in a manner which permits, on one hand, the board to be kept at small dimensions and to permit ready adaptation to wire wrapping machines and operation. In accordance with the preferred embodiment of the present invention, it is suggested to provide on the board rows of contact pins organized in groups and in parts separated by mounting space, also organized in rows for the mounting of LC circuit elements. Rows of sockets are provided in the mounting space and extending in the same direction as the rows of pins, for receiving the prongs as extending from the LC circuit elements in contact-making relationship. The pins and sockets are aligned in a direction transverse to the extension of the rows, and there is one socket in each row connected through printed circuit line connection with one (preferably two) pins of a row next to the respective row of sockets, but the PC line connection is on the other side of the board and extends transversely to the extension of the rows of pins. An edge of the board is provided with printed circuit terminal etchings individually connected to a plurality of pins, there being at least one column of pins extending in said transverse direction.

Wires are strung between the several pins of the plurality as needed whereby the wire stringing is carried out to lay the wires in accordance with a particular organization scheme. Wires are strung to follow the extension of the rows and alongside the rows of pins, and if a wire leads to a pin in a different row, there is provided one or several narrow regions in the transverse direction not occupied by any circuit elements to lead the wire toward a different row. A similar narrow space is provided between the end of the rows of circuit elements and the column of pins along the terminal etching.

As stated above, each socket is preferably connected with two aligned pins so that in case of plural connections enough winding space is provided. Also, in case of a faulty wire wrapping connection, unwrapping is unnecessary. The faulty connection is cut, and a replacement connection is wired. It should be noted that each pin can support only one or two wrapped wires, as a pin should not be made too long. The overall height of the assembly, including the extension of pins, should not exceed the height necessary for the LC circuit elements with their prongs to be securely and properly mounted in spaced-apart relationship to the surface of the board.

The surface are on both sides of the board and underneath the circuit elements is occupied by voltage supply platings provided as strips parallel to the rows and there along. In order to provide for a universal type mounting structure, plural parallel socket rows for one row of mounting space, may be provided to accommodate differently wide LC circuit elements along the same row. The several additional sockets are, in addition, interconnected by printed circuit lines on the respective other side of the board preferably in alignment with the printed circuit type of connection that leads to the pins.

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

Figures 1, 2:
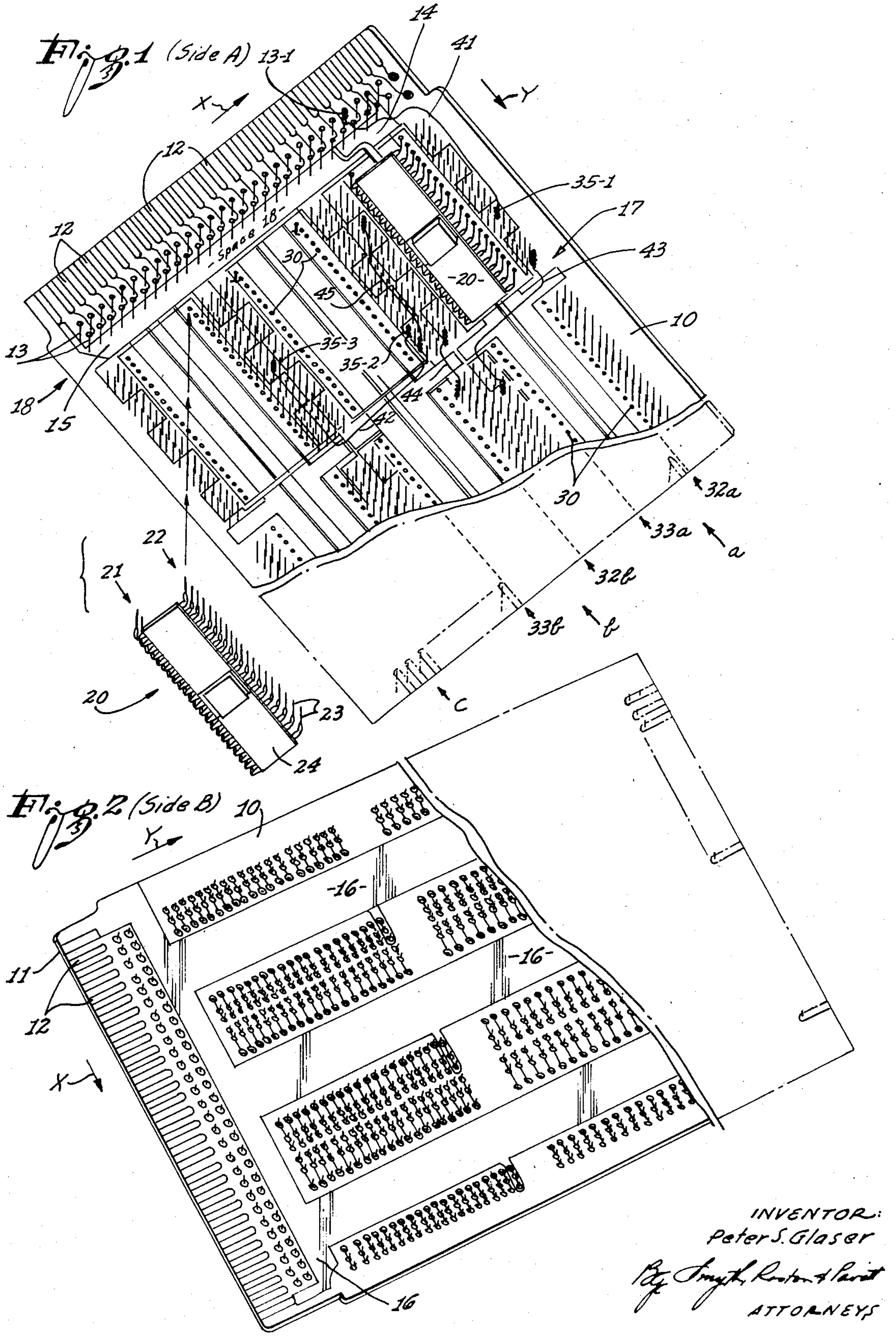
FIG. 1 illustrates somewhat schematically the perspective view of a board in accordance with the preferred embodiment of the invention and as seen from below, illustrating one side thereof.
FIG. 2 illustrates the same board in perspective view as seen from the other side.

Proceeding now to a detailed description of the drawings, there is illustrated a printed circuit board 10 made of conventional insulative material. The principal function of this board is to mount multi-pin, or prong, large- scale integrated circuit elements or LC circuits, for short, such as element 20, having two rows 21 and 22 of connector pins or prongs, such as 23. These prongs connect to plating in and through an insulating plate 24 to the LC chip proper thereon.

The board 10 is constructed and has layout and primary purpose to accommodate such LC circuits. However, the board is not restricted to mounting of LC circuits as frequently discrete circuit elements are also to be mounted within the circuit pattern. The layout permits that accommodation. Discrete circuit elements include, for example, inductances or power amplifiers which are presently not included or includable within an LC chip.

Various elements, components, etc. on the board are organized along a coordinate system designated by axes X and Y in the drawings. As basic organization scheme, the various components are to be mounted in rows, along one axis, e.g., the Y axis. The board is shown to have three rows, *a*, *b* and *c*, of such components. These numbers are, of course, representative only and have particularly validity for a card of about 4 × 6 ½ inches. Board 10 has an edge 11, and terminal etchings 12 are provided along this edge on both sides of the board, A and B. The etchings respectively align in pairs across the thickness dimension (Z axis) of the board. The column of etchings extends along the X axis. These terminal etchings are provided for connection to the contact elements of a suitable terminal connector element of conventional construction.

Figure 5:
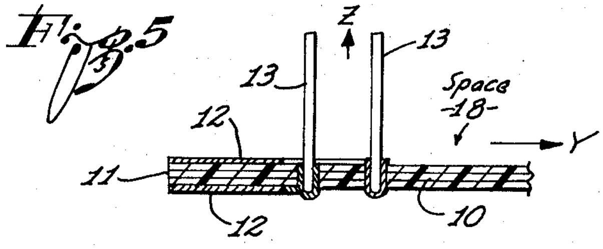
FIG. 5 illustrates a different section view near the terminals-bearing edge of the board.

Two columns of pins 13 are anchored in the board, insulated from each other and individually extending from side A up along the Z axis, transverse to the (X, Y) plane of the board. The two columns of pins extend along the X axis alongside edge 11, and the pins of the columns are aligned, in pairs, along the Y axis and with pairs of terminal etchings (see FIG. 5). One pin of such a pair connects to a terminal etching on side A, the other on side B, the connections being made by soldering or printed circuit line techniques, etc.

Not all terminal etchings connect to pins 13 of the columns, some of these etchings, particularly those on the outside, connect to voltage supply platings, such as 14, 15, or to a ground plate 16. The ground plate 16 extends on side B underneath the space provided for the circuit elements mounted on side A. The voltage supply platings 14 and 15 extend on that side A but underneath the elements to be mounted thereon and not in contact therewith.

For mounting of circuit elements, such as LC element 20 and others, there are provided two rows of sockets 30 for each row of elements. The sockets may be established simply by apertures in the board with a metallic lining or socket insert 31. These inserts receive connector pins or prongs such as 23 in contact making engagement therewith and being soldered thereto. The solder extends predominantly on the other side, i.e., side B of the particular board.

For mounting a row of LC elements in alignment along the Y axis, two of such rows of sockets are arranged, substantially along the entire dimension of the card in that direction the two rows of sockets are spaced-apart in direction of the X axis so that oppositely placed connector prongs of the same LC circuit element can be received by sockets of the two rows.

Two such rows are, for example, identified by reference number **32*a* and 33*a*** for element row *a;* two other rows are identified by reference numerals **32*b* and 33*b*** for element row *b*, etc. There are altogether three such pairs of rows of sockets including the rows as mentioned to permit mounting of LC circuit elements in the three rows *a*, *b* and *c*.

Parallel to each row of circuits as extending in the direction of the Y axis is provided a double row of pins. The pins are collectively and individually denoted by reference numeral 35. These pins extend through appropriate apertures in the board and are anchored therein through soldering. Of course, the pins are correspondingly arranged in rows along the Y axis, the several rows being spaced-apart in the direction of the X axis. As can be seen by comparison of the several figures, each of the pins 35 extends along the Z axis and the rows, as extending in the direction of the Y axis are defined transverse to the plane of the drawing of FIG. 3.

Figure 3:
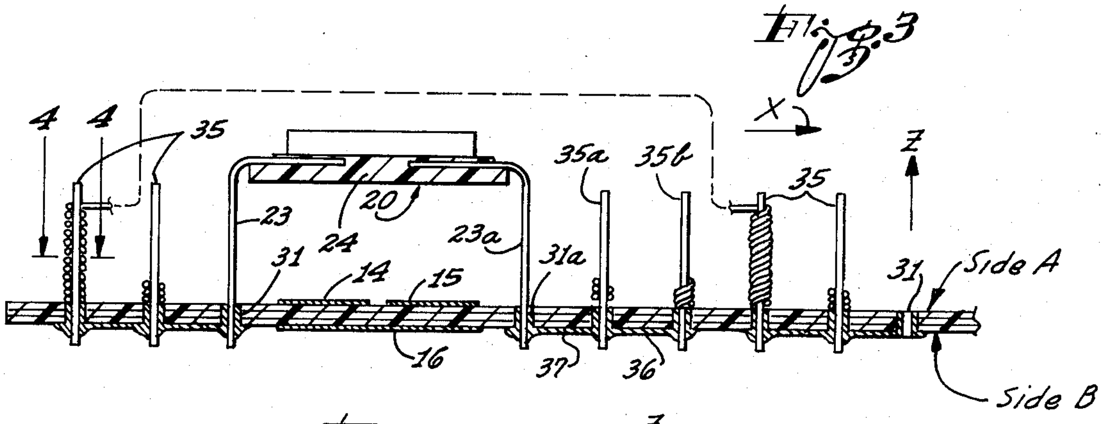
FIG. 3 illustrates a section view through a portion of a board in an enlarged view.
Figure 4:
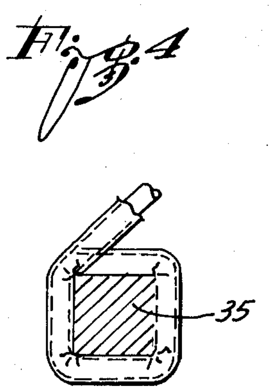
FIG. 4 illustrates enlarged section of a wire wrapped pin.

The rows of pins, as thus provided, extend also in alignment, as far as an individual pin is concerned, with the sockets of the several rows. In particular, each socket is aligned in the direction of the X axis with two pins of different but neighboring rows. For example, the particular socket **31*a* of FIG. 3 is aligned with the pins 35*a* and 35*b*** in the direction of the X axis. This holds true for each socket. The pins are spaced in the X and Y directions for a distance sufficient to permit individual wire wrapping about any pin as is representatively shown for several of the pins.

Printed circuit type etchings or solder lines, such as 36, interconnect pins of a pair on side B, and another similar connection 37 connects them with the respective associated socket, such as **31*a*. That socket, in turn, connects to a particular prong such as 23*a* which extends from an integrated circuit element 20. Selected ones of the pins 35 are directly connected to ground plating 16, others connect directly to voltage supply platings 14 and 15**, as each LC circuit element requires ground and, at least, one supply voltage level for internal operation.

In order to provide electrical interconnection among the integrated circuit elements on the board, selected pins of the group 35 as defined are interconnected, the interconnection leading from a pin that is connected to an LC circuit element to a pin that is connected to a different LC circuit. Other pins of the group 35 connect to selected pins of the group 13 (for input/output).

The basic wire connection from any pin to any other pin leads in direction of the Y axis along the rows to which the pins pertain; that, however does not suffice. The board is, furthermore, organized in that within a limited region the connecting wires may change direction in case source and destination pins are in different rows, separated by at least one row of mounted elements. This particular narrow space is identified by reference numeral 17 in about the middle of the board. It is defined by gaps in the elements of each row, and these gaps are aligned in the X axis. For larger boards, there may be additional narrow space provided in that manner. In addition, there is wiring space along the direction of the X axis provided between the column of pins 13 and the closest ends of the several rows of pins 35 and circuit elements 20 as mounted. This region is collectively denoted with reference numeral 18.

The figure illustrates a few representative examples to be described next as typical cases for wire interconnection. For signal input or output to the plurality of LC circuits as a whole, particular pins of the group 35 are connected to particular pins of the group 13, as stated. Thus, for example, the wire 41 is strung from a pin 35–1 to a pin 13–1. The pin 35–1 pertains to one of the two rows of pins that extend next to the row **32*a* or sockets. Wire 41 has a first portion that extends along the row of pins to which pin 35–1 pertains, i.e., in the direction of the Y axis, toward the column of pins 13 as extending in the direction of the X axis. Near that column wire 41 veers toward the particular pin 13–1, i.e., it has an X directional component within the wiring space 18. It can readily be seen that the wiring space 18, having predominant extension in the X direction between the column of pins 13 and the adjacent end of the rows of pins 35, may accommodate the several portions of the connecting wire that require displacement in the X direction. Those few pins of the plurality 13 in line (in Y direction) with a row of pins 35** usually do not suffice for connection to all those pins of that row that require input or output connection.

It can, thus, be seen that in most cases a wire as leading from a first pin (of the plurality 35) to a second pin of the group 13 has a Y component along the row of the first pin, and an X component of extension within the wiring space 18. This does not hold true for a wire that extends from a pin of the group 35 close to the pin column 13 and for a wire that extends toward the pin of column 13 direct in line with the respective row of pins. In the former case there is no Y component, in the latter case there is no X component of extension of the respective wire; these, however, are exceptions, but fall still in the general rule that wires are strung only in X and Y directions.

Other situations of wire connections will be discussed next and they involve connections between pins that connect to different LC terminal prongs. The wire 42 is connected between pin 35–2 to a pin 35–3. The wire 42, as extending from pin 35–2, has a Y component toward the narrow region 17 not occupied all the way through in the X direction by any circuit element. Within that narrow wiring region, wire 42 extends in the X direction until reaching the row of pins to which destination pin 35–3 pertains. Along that row the wire has again a Y component of extension until reaching pin 35–3.

A wire 43 depicts a similar situation showing that after reaching the row of the destination pin, the wire may veer back into the Y direction in continuation of the original Y direction adjacent to source pin (rather than back as in the case of wire 42). The wire 44 represents the situation that source and destination pins pertain to the same row. Wire 45 represents a situation where source and destination pins pertain to adjacent rows and connect to sockets of different rows not separated by a row of circuit elements. In these two cases, wires 44 and 45, there is no X component except that for the latter type situation, there is an X directional displacement. In case source and destination pins in different rows are not far apart as far as a Y component is concerned, there will inherently be a predominant X directional displacement component of the connecting wire that is rather short to begin with.

Two pins are available for each LC terminal and prong for wire wrapping. Utilization of a double pin for each connection to an LC connector prong is of great advantage in case a faulty connection was made; instead of having to remove a connecting wire, that wire may simply be cut. Additional connections will not be affected due to the double use of the pins. It must be noted that no more than two wire wrapping connections may be accommodated on one pin. This is particularly important, if an LC terminal is to be connected to more than one other terminal and it turns out that one of the connections is faulty. The replacement connection does not require removal of the faulty one but it may merely be cut, and by using the respective other pin for making the correct connection, the pattern can be corrected and the correct portion of the established pattern is not being disturbed.

Figure 6:
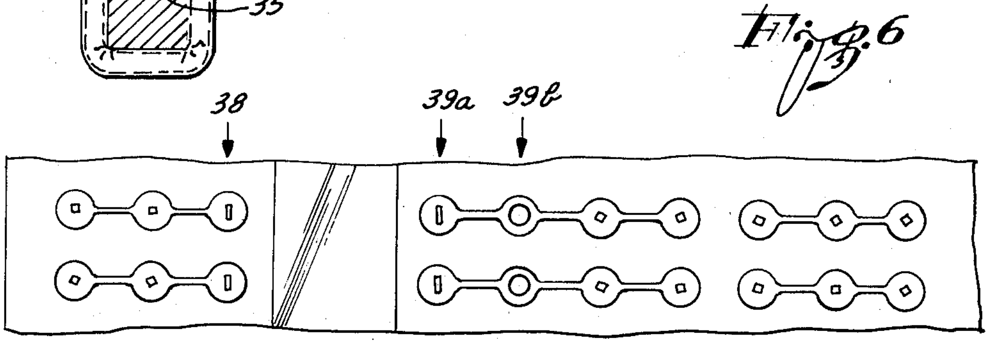
FIGS. 6 and 7 illustrate elevations of opposite sides of a portion of a somewhat modified board.
Figure 7:
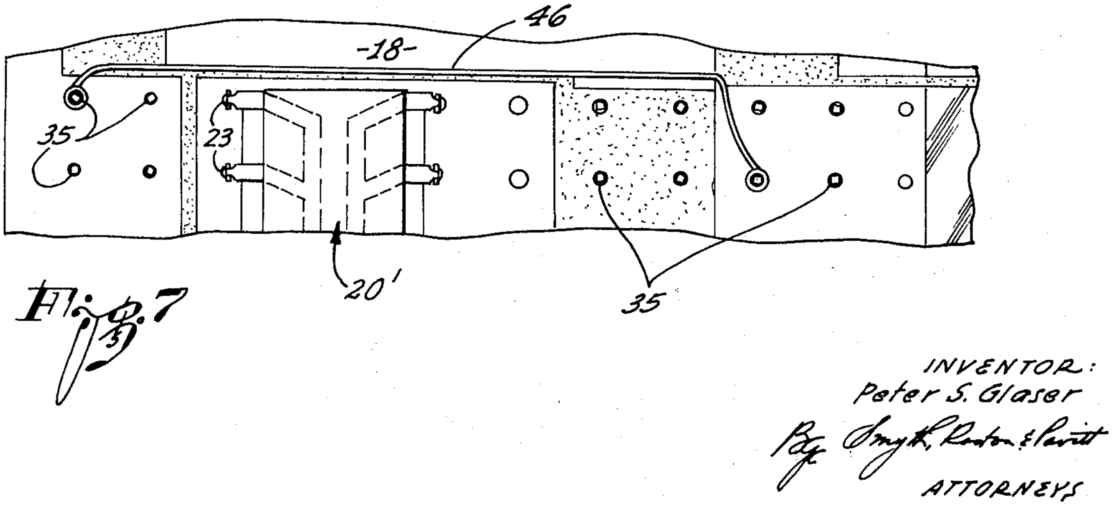

As shown in FIGS. 6 and 7, all mounting spaces on the board or, e.g., one row on the same board, may be provided to accommodate differently wide LC circuits, width being taken in the X direction when mounted for placement along the Y direction. There may be one row, such as 38, of connector sockets 31, and, for example, two (or more) rows, such as **39*a* and 39*b* defining one row of mounting space for circuit elements. One aperture and socket per row, are all aligned in the X direction. Two of each of the aligned sockets or rows, 39*a* and 39*b*, are interconnected by means of etching, the connection leading further to two pins, so that independent from the dimensions in the X direction of an IC, LC or discrete circuit element, one or the other rows of sockets can be used for receiving the respective prongs. The pattern of pins that are interconnected by wires is not disturbed in that manner. In the illustrated example, the LC element 20' is narrower, so that its prongs are received by sockets of rows 38*a* and 39*a***.

The invention is not limited to the embodiments described above but all changes and modifications thereof not constituting departures from the spirit and scope of the invention are intended to be included.

I claim:

1. A mounting structure mounting circuit elements including a plurality of multi-pin large-scale integrated circuits, each having two rows of connector pins, the mounting structure including a printed circuit board having a mounting edge along a first axis and individually printed circuit terminal platings there along, further having two edges extending transverse to the mounting edge and in direction along a second axis transverse to the first axis, the improvement comprising:

a plurality of rows of sockets defining apertures, the sockets of a row extending in a direction of the second axis parallel to each other and in pairs, the rows of each pair spaced-apart in the direction of the first axis a distance of about equal to the distance between the rows of connector pins, receiving the connector pins of the large-scale integrated circuits mounting the large-scale integrated circuits on the one side of the board;

a plurality of rows of terminal pins, the terminal pins extending from the one side of the board, the rows extending in a second direction and in pairs, the row of pins of a pair extending next to a row of socket defining apertures but spaced-apart in the first axis and on the side opposite to the disposition of the other row of apertures of the respective pair; the space along a row of terminal pins being unobscured for the extension of the row permitting stringing of wire therealong, along the entire extension of the row in direction of the second axis;

printed circuit lines extending individually along the first axis from an aperture to the closest terminal pin on the other flat side of the board;

a plurality of additional terminal pins extending from the one side of the board and arranged in columns in the first direction along the terminal platings and being conductively connected individually thereto;

a first plurality of connecting wires extending individually from a pin of a row to a pin of a column, each wire having a first portion extending along the row in the second axis to a pin of a column in the second portion traversing the space between the end of the row and the column of pins and veering in a direction of the first axis;

a second plurality of connecting wires extending from a pin of a row as connected to a socket aperture for receiving a pin of a large-scale integrated circuit, to a pin of the same or the next row, not separated by a row of circuit elements, substantially along the second axis; and a third plurality of connecting wires each wire thereof having a first portion extending in the first axis in between two rows of pins of the pluralities, separated by at least one row of circuit elements, the first portions of the wire of the first plurality as so extending occupying limited space defined by gaps in the circuit elements in each row and aligned in the first axis, the third plurality of wires each having two terminal portions in the second axis extending to one pin in each of the respective two rows, any wire as pertaining to one of the first, second and third pluralities and as connected between two pins having two ends respectively wrapped around the two pins.

2. A mounting structure as in claim 1, each first row of pins associated with a second row of pins, the pins of the first row individually aligned with the pins of the respectively associated second row in a direction of the first axis and connected by means of printed circuit means on the other side of the board.

3. A mounting structure as in claim 1, at least some of the pairs of rows of socket defining apertures associated with at least one additional row of socket defining apertures disposed in between, there being printed circuit means from the socket defining apertures of the additional row to the socket defining apertures of one of the rows of the pair and in a direction of the first axis.

4. A mounting structure as in claim 1, there being power supply plating on at least one side in between the aperture rows of a pair and having extensions in the direction of the second axis.

5. A mounting structure as in claim 1, each first row of pins associated with a second row of pins, the pins of the first row individually aligned with the pins of the respectively associated second row in a direction of the first axis and connected by means of printed circuit means on the other side of the board; and power supply plating on both sides of the board in between the aperture rows of a pair and having extensions in the direction of the second axis.

* * * * *